United States Patent [19]

Vasquez

[11] Patent Number: 5,059,581
[45] Date of Patent: Oct. 22, 1991

[54] PASSIVATION OF HIGH TEMPERATURE SUPERCONDUCTORS

[75] Inventor: Richard P. Vasquez, Altadena, Calif.

[73] Assignee: The United States of America as represented by the Administrator of the National Aeronautics and Space Administration, Washington, D.C.

[21] Appl. No.: 545,016

[22] Filed: Jun. 28, 1990

[51] Int. Cl.$^5$ .......................... B05D 5/12; C23F 1/00
[52] U.S. Cl. ...................................... 505/1; 505/728; 427/62; 427/343; 156/637
[58] Field of Search .......................... 505/1, 725, 728; 427/62, 63, 343; 156/637

[56] References Cited

U.S. PATENT DOCUMENTS

| | | | |
|---|---|---|---|
| 4,330,347 | 5/1982 | Hirayama et al. | 148/31.5 |
| 4,341,572 | 7/1982 | Tachikawa et al. | 148/11.5 F |
| 4,343,867 | 8/1982 | Luhman et al. | 428/614 |
| 4,765,055 | 8/1988 | Ozaki et al. | 29/599 |
| 4,826,808 | 5/1989 | Yurek et al. | 505/1 |

OTHER PUBLICATIONS

Shih et al., "Chemical Etching of Y—Cu—Ba—O Thin Films" Appl. Phys. Lett. 52(18) May 1988, pp. 1523-1524.
Yashizako et al., "Chemical Etching of High-Tc Superconducting Y—Ba—Cu—O Films in Phosphoric Acid Solution", Jpn. J. Appl. Phys. 26(9) Sep. 1987, L1533-11534.
Shokoohi et al., "Wet-Chemical Etching of High-Temperature Superconducting Y—Ba—Cu—O Films in Ethylene diaminetetraacetic Acid", Appl. Phys. Lett. 55(25) Dec. 1989, pp. 2661-2663.
R. P. Vasquez, B. D. Hunt, and M. C. Foote, Appl. Phys. Lett., 53, 2692 (1988).
R. P. Vasquez, M. C. Foote, and B. D. Hunt, Appl. Phys. Lett., 54, 1060 (1989).
M. Gurvitch, J. M. Valles, Jr., A. M. Cucolo, R. C. Dynes, J. P. Garno, L. F. Schneemeyer, and J. V. Wasczak, Phys. Rev. Lett., 63, 1008 (1989).
R. P. Vasquez, B. D. Hunt and M. C. Foote, Appl. Phys. Lett., 54, 2373 (1989).
D. M. Hill, H. M. Meyer III, J. H. Weaver, and D. L. Nelson, Appl. Phys. Lett., 53, 1657 (1988).
Q. X. Jia and W. A. Anderson, J. Appl. Phys., 66, 452 (1989).
R. P. Vasquez, M. C. Foote, and B. D. Hunt, J. Appl. Phys. 66, 4866 (1989).
Q. X. Jia and W. A. Anderson, J. Mater. Res. 4, 1320 (1989).
A. Tressaud, B. Chevalier, B. Lepine, J. M. Dance, L. Lozano, J. Grannec, J. Etourneau R. Tournier, A. Sulpice, and P. Lejay, Mod. Phys. Lett. B, 2, 1183 (1988).
R. P. Vasquez, M. C. Foote, and B. D. Hunt, Appl. Phys. Lett. 55, 1801 (1989).

Primary Examiner—Shrive Beck
Assistant Examiner—Roy V. King
Attorney, Agent, or Firm—Thomas H. Jones; Harold W. Adams; John R. Manning

[57] ABSTRACT

The surface of high temperature superconductors such as $YBa_2Cu_3O_{7-x}$ are passivated by reacting the native Y, Ba and Cu metal ions with an anion such as sulfate or oxalate to form a surface film that is impervious to water and has a solubility in water of no more than $10^{-3}$ M. The passivating treatment is preferably conducted by immersing the surface in dilute aqueous acid solution since more soluble species dissolve into the solution. The treatment does not degrade the superconducting properties of the bulk material.

11 Claims, 1 Drawing Sheet

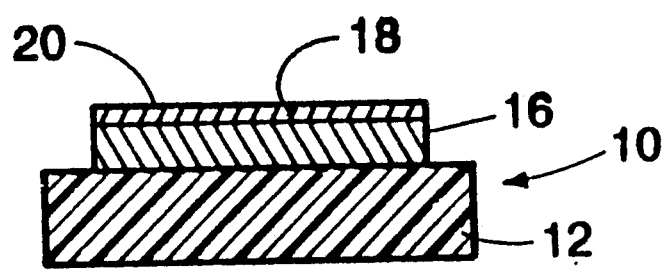
Figure

PASSIVATION OF HIGH TEMPERATURE SUPERCONDUCTORS

ORIGIN OF THE INVENTION

The invention described herein was made in the performance of work under a NASA contract, and is subject to the provisions of Public Law 96-517 (35 USC 202) in which the Contractor has elected not to retain title.

DESCRIPTION

1. Technical Field

This invention relates to passivation of high temperature superconductors and, more particularly, this invention relates to a method of passivating the surface of high temperature superconductors by reacting the native metal ions of the superconductor with anions to form a water insoluble film of the metal ions and the anions while not affecting the superconducting properties of the superconducting material.

2. Background of the Invention

The recent discovery of high critical temperature superconducting (HTSC) materials has created interest in the use of these materials in electronic devices. The HTSC materials are mixed metal cuprates in layered crystalline form. One of the metals is usually a rare earth metal such as Yttrium and the other metal can be an alkaline earth metal such as barium. $YBa_2Cu_3O_{7-x}$ is a representative HTSC material.

However, a major obstacle to developing devices from the HTSC cuprate materials is their stability in the environment. Formation of even small levels of nonsuperconducting materials may increase contact resistance or lead to significant increases in microwave surface losses. This will seriously degrade performance of superconducting contacts, microwave striplines, tunnel junctions and other devices formed from the superconducting material. The nonsuperconducting species can result from surface degradation during growth of the cuprate material and also from an exposure to moisture and $CO_2$.

The non-superconducting species present on the surface of polycrystalline films (1,2) and single crystals (3) of $YBa_2Cu_3O_{7-x}$ cuprate HTSC materials can be chemically removed without damaging the underlying superconductor. However, surface degradation reoccurs on exposure to air (4).

Recently, $YBa_2Cu_3O_{7-x}$ films grown by laser ablation, with no observable grain boundaries, have been reported (5) to be unreactive to water, in the sense that $T_c$ is unaffected. The reported sensitivity of the bulk superconducting properties of $YBa_2Cu_3O_{7-x}$ to moisture (6–8) may thus be a consequence of the grain structure of the polycrystalline samples, rather than an intrinsic property of the material. Although the surface properties of films grown by laser ablation and subsequently exposed to air have not been reported, it is likely that nonsuperconducting species will form and that passivation of this material will also prove necessary for devices in which surface properties are critical.

The Bi- and Tl-based superconductors have been reported to be less reactive to air, based on the fact that $T_c$ and other bulk properties do not degrade with time. However, results obtained in this lab indicate that $Bi_4Sr_3Ca_3Cu_4O_{16+x}$ does form carbonates and other nonsuperconducting species on the surface, even though bulk electrical properties are unaffected after 3 months in air (9). Nonsuperconducting surfaces thus appears to be a problem common to many, if not all, high temperature superconductors.

3. Description of the Prior Art

Several approaches to passivation have previously been studied. Incorporation of Ag in the film during growth improves passivation properties and maintains low contact resistance (10,11). However, slow degradation of the electrical properties is observed and the surfaces of such films have yet to be studied. Vacuum deposition of $CaF_2$ or the oxides of Bi, Al, or Si onto superconductor surfaces has also been studied (12,13). However, these experiments involved primarily studies of the superconductor/dielectric interface rather than the passivation properties. Another approach involves post-growth chemical treatment of the superconductor with reactants such as HF solutions in absolute ethanol (4,14–16) or $F_2$ gas (17). These treatments form nonreactive species, especially Y and Ba fluorides, on the film surfaces.

However, tests on the HF/EtOH treated surfaces (16,18) showed that the rate of reaction of the $Y_1Ba_2Cu_3O_{7-x}$ cuprate superconductor with air could only be slowed rather than eliminated. Other chemical treatments of the cuprate superconductor surface with nonaqueous halogen reagents (1,14) have proven ineffective. Bromide and chloride films were also found to react with air. Thus, there is no effective technique available for passivation of the surface of HTSC cuprate materials.

STATEMENT OF THE INVENTION

An effective passivation of the surfaces of high temperature superconductors is provided by the present invention. Superconducting surfaces treated in accordance with the invention are found to be stable in air, water and/or carbon dioxide. The surface treatment does not affect the superconducting properties of the surface layer nor of the bulk material. Passivation is effected by reacting the native metal ions of the superconductor with reagents that form a layer of a salt that has a solubility in water of no more than $10^{-3}$ moles of metal ion per liter and which does not degrade the superconducting properties of the surface or the bulk of the superconducting material.

The passivating surface layer can be formed by wet chemical techniques, by gas-phase reaction or by deposition. Since there are at least 3 native metals in the bulk of the high temperature superconductor, salts of varying solubility in water are formed after application of a single reactive anion to the surface whether by liquid or gas phase deposition. In case of non-aqueous solvent, the water-soluble species may remain on the surface. In case of gas phase reaction, non-volatile water-soluble salts again remain on the surface. The more water soluble species will slowly react with water and carbon dioxide when exposed to the ambient and will degrade the surface. It is, therefore, preferred to form the passivation layer by reaction with a liquid reagent and, most preferably, an aqueous liquid reagent which permits the more soluble species which form to dissolve in the aqueous reagent. The resulting passivation layer is thus formed of more water-in-soluble species. The reagent provides a source of reactive anion, X. The preferred anion source is an acid such as a hydrohalic acid, sulfuric acid or oxalic acid or $H_2S$ or a Group I or ammonium salt thereof.

The post-growth chemical treatment of the invention results in formation of surface layers of salts of the native superconductor metal ions such as CuI, $BaSO_4$, CuS and/or $Cu_2S$. All these salts have very low solubility in and reaction with water. CuI has the additional advantage of being a semiconductor permitting forming contacts or junctions directly on the surface of the superconductor rather than directly to the bulk superconductor.

The method of the invention provides surface layers which have been passivated to environmental degradation. XPS analysis confirms that the native metal compounds that are formed are virtually insoluble in water. X-ray diffraction has been conducted to monitor the effects of the treatment on the bulk of the superconductor films. The method of the invention induces no detectable damage of the superconducting films. The passivating layers of the invention are both insoluble in water and impermeable to water. They do not permit water or water vapor to reach the underlying bulk superconductor. The surface layer encapsulates and protects the underlyinq bulk superconductor permitting long service life of superconducting devices in the ambient.

These and many other features and attendant advantages of the invention will become apparent as the invention becomes better understood by reference to the following detailed description when considered in conjunction with the accompanying drawings.

BRIEF DESCRIPTION OF THE DRAWING

The FIGURE is a schematic view of a superconductor treated in accordance with the invention.

DETAILED DESCRIPTION OF THE INVENTION

The high critical temperature ($T_c$) superconducting materials (HTSC) passivated in the present invention are metal cuprates having a $T_c$ above about 30K, usually above 70K. The HTSC materials have an ordered lattice and are usually crystalline ceramics of the general formula $$M_x^1 M_y^2 Cu_2 O_n$$

where $M^1$ is a Group IIIA metal, Group IIIB metal, Group VB or a rare earth metal, $M^2$ is a Group IIA metal and x, y, z and n are integers. Usually the ratio of y:x is about 2:1 and the ratio of z:x is at least 3 usually from 3:1 to 6:1. The oxygen is present in an amount to satisfy valency of the metals and n is usually no more than 20, typically about 5–15.

$M_1$ can be a Group IIIA metal such as Yttrium (Y) or Lanthanum (La), a Group IIIB metal such as Thallium (Tl), Group VB metal such as Bismuth (Bi) or a rare earth metal such as Erbium (Er), Cerium (Ce), Praseodymium (Pr), Samarium (Sm), Europium (Eu), Gadolinium (Gd), Terbium (Tb), Dysprosium (Dy), Holmium (Ho), Ytterbium (Yb), Lutetium (Lu) or combinations of these metals. $M^2$ is a Group IIA metal such as strontium, barium, calcium or mixtures thereof.

The most common high temperature cuprates are the rare earth-alkaline earth metal cuprates where $M^1$ is Yttrium of the formula:

$$YBa_2Cu_3O_{7-x}$$

where x is $< \sim 0.45$.

Other available HTSC materials are lanthanum based materials of the formula:

$$(La_{1-x}M_x^2)CuO_{4-y}$$

where $M^2$=Ba, Sr or Ca and $x < \sim 0.2$ and $y < \sim 0.1$.

Bismuth-based HTSC cuprates have a composition such as:

$$Bi_2Ca_{1+x}Sr_{2-x}Cu_2O_{8+y}$$

and thallium-based cuprates have a composition such as:

$$TlBaCu_3O_{5.5+x}$$

or $$Tl_2Ca_2Ba_2Cu_3O_{104x}$$

Lead-based cuprates can be selected from compounds such as:

$$Pb_2Sr_2Y_{1-x}Ca_xCu_3O_8$$

Bulk forms of HTSC materials are difficult to grow and to process into devices. Most devices are formed in situ by growing the cuprate film directly on a substrate. The substrate should provide a clean epitaxial surface for growing HTSC materials. Typically the substrate is a material selected from strontium titanate, lanthanum aluminate, magnesium oxide or yttrium stabilized of zirconia (YSZ). The HTSC can be formed by a variety of processes such as sputtering, laser ablation or metallo-organic chemical vapor deposition (MOCVD). All of the techniques for preparing the substrate and depositing the HTSC film are well known in the art and do not form a part of this invention.

In off-axis sputtering the substrate is placed on a substrate holder in a sputtering chamber. The substrate is heated to a temperature of from about 650° C. to 900° C. The chamber contains from 10–50% of an oxidizing gas such as oxygen or nitrous oxide. The vapor source is a composite ceramic in the correct stoichiometric ratio for the film such as $Y_1Ba_2Cu_3$ alloy or pressed powder source. Deposition is usually conducted at a high pressure in oxygen at a temperature from 400° C. to 900° C. can be conducted.

$M^1$, $M^2$ and copper, the native materials of the HTSC form a variety of compounds when reacted with reactive anions. The solubilities of various native metal compounds are provided in Table 1.

TABLE 1

Aqueous solubilities, in moles of metal ion per liter, of Y, Ba, and Cu compounds of relevance to this work, calculated from the tabulated solubilities or solubility products from Ref. 19.

| Compound | Solubility |
|---|---|
| $Y_2(C_2O_4)_3 \cdot 9H_2O$ | $3.3 \times 10^{-6}$ |
| $BaC_2O_4 \cdot 2H_2O$ | $3.5 \times 10^{-4}$ |
| $CuC_2O_4$ | $1.7 \times 10^{-4}$ |
| $Y_2(SO_4)_3$ | 0.24 |
| $BaSO_4$ | $1 \times 10^{-5}$ |
| $CuSO_4$ | 0.90 |
| $Y_2S_3$ | not measured |
| BaS | decomposes |
| CuS | $9 \times 10^{-23}$ |
| $Cu_2S$ | $2.7 \times 10^{-16}$ |
| $YI_3$ | very soluble |
| $BaI_2$ | 4.35 |
| CuI | $2.25 \times 10^{-6}$ |

TABLE 1-continued

Aqueous solubilities, in moles of metal ion per liter, of Y, Ba, and Cu compounds of relevance to this work, calculated from the tabulated solubilities or solubility products from Ref. 19.

| Compound | Solubility |
|---|---|
| $YF_3$ | insoluble |
| $BaF_2$ | 0.012 |
| $CuF_2$ | 0.46 |

Table 1 can be utilized as a guide to select native compounds having low solubility in water. A low solubility in water does not guarantee passivation. The compound must not react with the bulk superconductor in a manner affecting electrical or electronic performance or allow reactive species to diffuse to the bulk superconductor. For example, $BaCO_3$ forms naturally on $YBa_2Cu_3O_{7-x}$ (123) surfaces in air and has a low aqueous solubility. However, the superconducting properties of the bulk 123 material degrade.

CuI, $BaSO_4$, CuS, $CaF_2$, $PbC_2O_4$, PbS, TlI and $Tl_2S_3$ all have low solubilities and would appear to form stable, passivating surface films without affecting the properties of the bulk.

The passivating films are formed by applying a reactive anion such as S, $SO_4$, halide or oxalate to the surface and reacting the anion with $M^1$, $M^2$ and/or Cu to form a layer insoluble and impervious to water.

The anion can be delivered to the surface in the gas phase or liquid phase. The highest quality layers are formed by use of an aqueous solution of the reagent since this permits removal of water soluble compounds from the layer. Gas phase reactants have the disadvantage of forming nonvolatile compounds which are reactive with water.

The treating solutions act as etchants. They are usually very dilute aqueous solutions of acids or Group I metal or ammonium salts. Generally the treating solutions have a concentration below about 0.01 to 0.5M. Representative reactive reagents useful in the method of the invention are acids such as HF, HI, $H_2C_2O_4$ and $H_2SO_4$ and salts such as $Na_2S$ or $(NH_4)_2S$. Gas phase reactants can be $F_2$ or $XeF_2$ which form native fluorides or $H_2S$ which forms native metal sulfides.

The solution can be applied to the surface by immersing the HTSC surface in the solution or by applying a layer of solution to the surface of the HTSC material. The treatment is generally conducted for 1 second to 5 minutes, usually from 15 to 60 seconds at a temperature from 0° C. to 50° C., preferably 15° C. to 25° C. The treatment forms a surface layer from 10 to 500 Angstroms in thickness, usually from 50 to 200 Angstroms in thickness.

Referring now to the FIGURE, the layered structure 10 is composed of a substrate 12, containing a thin film of HTSC material 16. The surface 20 of the HTSC film 16 is treated to form a passivating, encapsulating layer 18. HTSC film 16 may be laid down in a pattern to form a device by use of a mask formed by conventional photolithographic techniques or by use of shutters or shields.

The examples of practice of the invention will be directed to the YBaCuO materials of the general formula $Y_1Ba_2Cu_3O_{7-x}$ but the invention is equally applicable to other HTSC materials of the cuprate family such as the Bismuth cuprate of the general formula BiSrCaCuO or the thallium cuprate of the general formula TlBaCaCuO. The invention will now be illustrated by specific examples.

EXAMPLE 1

$YBa_2Cu_3O_{7-x}$ Film

1-$\mu$m-thick $YBa_2Cu_3O_{7-x}$ (123) films are grown on yttriastabilized cubic zirconia substrates by RF magnetron sputtering from a composite target of $Y_2O_3$, $BaF_2$, and CuO. Films are annealed for three hours at 865° C. in flowing $O_2$ and $H_2O$, then slow cooled in flowing $O_2$ at 3° C./min, and typically have zero resistance at 84 to 90K. The films are polycrystalline and randomly oriented, with a grain size of 0.2 to 2 $\mu$m. The XPS spectra are accumulated on a Surface Science Instruments SSX-501 spectrometer with monochromatized $AlK_\alpha$ x-rays (1486.6 eV), with the electron energy analyzer set to give a resolution of 0.85 eV. When necessary, sample charging is neutralized with a low energy electron flood gun in conjunction with a 90% transmitting fine mesh proximity screen, and the spectra are referenced to the C 1s line at 284.6 eV.

The 123 films were treated with reactive reagents (etchants) to form passivating films.

EXAMPLE 2

Passivation with Etchant Solutions

The liquid etchants are 1% (by volume) commercial HI (57 wt. %, stabilized) in EtOH, 1%$H_2SO_4/H_2O$, 1%$HF/H_2O$, 0.1 M or 0.01 M $Na_2S/H_2O$, or 0.1 M $H_2C_2O_4/H_2O$. The chemical treatments are done either by dipping the film in the etchant for 15 to 60 seconds, or by using a microliter pipette to drop the etchant onto the sample while spinning at 3600 rpm. The samples are then spun dry and immediately loaded into the XPS spectrometer. After recording XPS spectra, the samples are immersed in deionized water for 1 minute, spun dry, and XPS data are again measured. XPS spectra of reference compounds are accumulated on high purity powders, typically obtained packed in argon, pressed onto In metal. All chemical treatments of the superconductor films and the reference compound sample preparation are done in the ultrahigh purity $N_2$ atmosphere of a glove box Which encloses the sample introduction area of the XPS spectrometer.

The core level binding energies and Auger kinetic energies measured and from the literature for Y compounds, Ba compounds, Cu compounds and for the chemically treated 123 surfaces are summarized in Tables II, III and IV respectively. Where appropriate data from the literature has been restated so that the binding energy reference is 284.6 for C 1s or 84.0 eV for $Au4f_{7/2}$.

TABLE II

Summary of the measured core level binding energies and Auger kinetic energies in eV for Y compounds and chemically-treated $YBa_2Cu_3O_{7-x}$ surfaces. Numbers in parentheses are the measured full widths at half-maximum.

| | $Y3d_{5/2}$ | O 1s | Other | Source |
|---|---|---|---|---|
| $YBa_2Cu_3O_{7-x}$ | 155.8 (1.0) | 528.3 (1.8) | — | Ref. 14 |
| $Y_2(C_2O_4)_3.9H_2O$ | 158.1 (1.85) | 531.4 (2.2) | 288.3 (2.0, C 1s) | Ref. 20 |
| $YBa_2Cu_3O_{7-x}$ + $H_2C_2O_4$ | 158.1 | 531.6 | 288.4 (C 1s) | Ref. 29 |
| $Y_2(SO_4)_3$ | 158.7 (1.95) | 532.0 (2.1) | 168.9 (1.9, S $2p_{3/2}$) | Ref. 20 |
| $YBa_2Cu_3O_{7-x}$ + $H_2SO_4$ | 158.5 | 530.9 | 168.1 (S $2p_{3/2}$) | Ref. 29 |

TABLE II-continued

Summary of the measured core level binding energies and Auger kinetic energies in eV for Y compounds and chemically-treated $YBa_2Cu_3O_{7-x}$ surfaces. Numbers in parentheses are the measured full widths at half-maximum.

|  | $Y3d_{5/2}$ | O 1s | Other | Source |
|---|---|---|---|---|
| $Y_2S_3$, as received | 157.1 (1.6) | — | 160.7 (1.3, S $2p_{3/2}$) | Ref. 20 |
| $Y_2S_3$, sputtered | 157.4 (1.8) | — | 161.3 (1.6, S $2p_{3/2}$) | Ref. 20 |
| $YBa_2Cu_3O_{7-x}$ + $Na_2S$ | 157.6 | — | 161.3 (S $2p_{3/2}$) | Ref. 29 |
| $YI_3$ | 158.0 (2.0) | — | 618.9 (2.3, I $3d_{5/2}$) 517.3 ($IM_4N_{45}N_{45}$) | Ref. 29 |
|  | 158.1 | — | 619.0 (I $3d_{5/2}$) | Ref. 20 |
| $YBa_2Cu_3O_{7-x}$ + HI | 158.1 | — | 619.1 (I $3d_{5/2}$) | Ref. 29 |
| $YF_3$ | 158.9 (2.1) | — | 684.7 (2.4, F 1s) | Ref. 14 |
|  | 158.8 | — | 684.8 (F 1s) | Ref. 21 |
| $YBa_2Cu_3O_{7-x}$ + $HF/H_2O$ | 158.5 | — | 684.4 (F 1s) | Ref. 29 |

TABLE III

Summary of the measured core level binding energies and Auger kinetic energies in Ev for Ba compounds and chemically-treated $YBa_2Cu_3O_{7-x}$ surfaces. Numbers in parentheses are the measured full widths at half-maximum.

|  | $Ba3d_{5/2}$ | O 1s | $BaM_4N_{45}N_{45}$ | Other | Source |
|---|---|---|---|---|---|
| $YBa_2Cu_3O_{7-x}$ | 777.7 (1.6) | 528.3 (1.8) | 600.0 | — | Ref. 14 |
| $YBa_2Cu_3O_{7-x}$ + $H_2C_2O_4$ | 780.1 | 531.6 | 596.7 | 288.4 (C 1s) | Ref. 29 |
| $BaSO_4$ | 779.8 (2.3) | 531.5 (2.3) | 597.1 | 168.3 (1.8, S $2p_{3/2}$) | Ref. 29 |
|  | 779.7 | — | — | 168.6 (S 2p) | Ref. 22 |
|  | 780.7 | 532.2 | — | 169.6 (S 2p) | Ref. 23 |
|  | 780.7 | — | — | — | Ref. 24 |
| $YBa_2Cu_3O_{7-x}$ + $H_2SO_4$ | 779.4 | 530.9 | 596.3 | 168.1 (S $2P_{3/2}$) | Ref. 29 |
| BaS | 779.1 (2.0) | — | 599.4 | 159.8 (1.6, S $2p_{3/2}$) | Ref. 29 |
|  | 779.6 | — | — | 159.9 (S 2p) | Ref. 22 |
|  | — | — | — | 161.1 (S 2p) | Ref. 25 |
| $YBa_2Cu_3O_{7-x}$ + $Na_2S$ | 779.1 | — | 599.2 | 161.3 (S $2p_{3/2}$) | Ref. 29 |
| $BaI_2 \cdot 2H_2O$ | 780.4 (1.5) | — | 597.5 | 618.9 (1.4, I $3d_{5/2}$) 518.0 ($IM_4N_{45}N_{45}$) | Ref. 14 Ref. 14 |
| $YBa_2Cu_3O_{7-x}$ + HI | 780.4 | — | 597.1 | 619.1 (I $3d_{5/2}$) | Ref. 29 |
| $BaF_2$ | 779.8 (2.4) | — | 596.0 | 683.7 (2.2, F 1s) | Ref. 14 |
| $YBa_2Cu_3O_{7-x}$ + $HF/H_2O$ | 779.8 | — | — | 684.4 (F 1s) | Ref. 29 |

TABLE IV

Summary of the measured core level binding energies and Auger kinetic energies in eV for Cu compounds and chemically-treated $YBa_2Cu_3O_{7-x}$ surfaces. Numbers in parentheses are the measured full widths at half-maximum.

|  | $Cu2p_{3/2}$ | $CuL_3M_{45}M_{45}$ | O 1s | Other | Source |
|---|---|---|---|---|---|
| $YBa_2Cu_3O_{7-x}$ | 933.25 (3.2) | 918.9 | 528.3 (1.8) | — | Ref. 14 |
| $YBa_2Cu_3O_{7-x}$ + $H_2C_2O_4$ | None Observed | | 531.6 | — | Ref. 29 |
| $CuSO_4$ | 935.5 (4.1) | 916.2 | 532.0 (2.1) | 168.8 1.7, S $2p_{3/2}$ | Ref. 29 |
|  | 935.0 | — | — | 169.4 (S 2p) | Ref. 26 |
| $CuSO_4$ (aq) | 935.3 | 916.1 | — | — | Ref. 24 |
| $YBa_2Cu_3O_{7-x}$ + $H_2SO_4$ | None Observed | | 530.9 | — | Ref. 29 |
| $Cu_2S$ | 932.3 (1.25) | 917.5 | — | 161.7 (1.0, S $2p_{3/2}$) | Ref. 29 |
|  | 932.3 | 917.6 | — | — | Ref. 24 |
|  | — | — | — | 163.9 (S 2p) | Ref. 25 |

TABLE IV-continued

Summary of the measured core level binding energies and Auger kinetic energies in eV for Cu compounds and chemically-treated $YBa_2Cu_3O_{7-x}$ surfaces. Numbers in parentheses are the measured full widths at half-maximum.

| | $Cu2p_{3/2}$ | $CuL_3M_{45}M_{45}$ | O 1s | Other | Source |
|---|---|---|---|---|---|
| | 932.2 | 916.9 | — | 162.2 (S 2p) | Ref. 26 |
| | 932.2 | — | — | 161.6 (S 2p) | Ref. 27 |
| $Cu_7S_4$ | 931.9 | — | — | 161.7 (S 2p) | Ref. 27 |
| $Cu_9S_5$ | 932.2 (1.3) | 917.7 | — | 161.5 (0.95, S $2p_{3/2}$) | Ref. 29 |
| CuS | 932.0 (1.2) | 918.3 | — | 161.2, 162.0 (0.9, S $2p_{3/2}$) | Ref. 29 |
| | — | — | — | 162.3 (S 2p) | Ref. 25 |
| | 931.8 | 918.1 | — | 162.5 (S 2p) | Ref. 26 |
| | 931.6–932.0 | — | — | 161.5, 162.2–162.5 (S 2p) | Ref. 27 |
| | 932.1 | 918.2 | — | — | Ref. 28 |
| $YBa_2Cu_3O_{7-x}$ | 932.2 | 917.9 | — | 161.3 (S $2p_{3/2}$) | Ref. 29 |
| CuI | 932.5 (1.2) | 916.0 | — | 619.7 (1.1, I $3d_{5/2}$) | Ref. 29 |
| | | | | 517.8 ($IM_{45}N_{45}$) | Ref. 29 |
| $YBa_2Cu_3O_{7-x}$ + HI | 932.0 | 916.6 | — | 619.1 (I $3d_{5/2}$) | Ref. 29 |
| $Cu(OH)_2$ | 933.9 (3.3) | 916.9 | 530.7 (2.2) | — | Ref. 14 |
| | 934.2 | — | 531.2 | — | Ref. 28 |
| $YBa_2Cu_3O_{7-x}$ + HI, + $H_2O$ | 934.2 | — | 531.0 | — | Ref. 29 |
| $CuF_2$ | 936.3 (4.0) | 915.7 | — | 684.6 (2.4, F 1s) | Ref. 14 |
| $YBa_2Cu_3O_{7-x}$ + HF/$H_2O$ | None observed | | — | 684.4 (F 1s) | Ref. 29 |

EXAMPLE 5

A 123 film from Example 1 was dipped for 30 seconds in 0.1 M $H_2C_2O_4/H_2O$. This treatment induces no detectable change in the film thickness, as determined with a profilometer, and subsequent x-ray diffraction measurements show that the superconducting bulk of the film is unaffected. The ratio of Y:Ba in the resulting surface oxalate film is 1:1, while no Cu is detected. The Y 3d spectrum and the O 1s and C 1s spectra are all consistent with spectra measured from the reference compound $Y_2(C_2O_4).9H_2O$. The Ba is presumably also present as the oxalate, $BaC_2O_4$. The oxalate film is of sufficient thickness that the underlying superconducting phase is not detectable in the XPS spectra, and is sufficiently insulating that sample charging is observed. No significant changes are observed in the XPS spectra when this sample is subsequently dipped in deionized water for 1 minute. This is consistent with the expectation that the reactivity of the oxalates to water, as deduced from their solubilities, is low. This treatment thus appears to be useful as a passivation technique. Immersion of the superconducting film n the oxalic acid solution for as long as 20 minutes did not visibly affect the film and induced no changes in the XPS spectra, indicating that the formation of the oxalate film may be self-limiting, or that the etch rate is very slow.

EXAMPLE 4

A 123 film from Example 1 was dipped in 1% $H_2SO_4/H_2O$ for 30 seconds. Barium sulfate, $BaSO_4$ has a very low solubility in water, while the corresponding Y and Cu sulfates, $Y_2(SO_4)_3$ and $CuSO_4$, are soluble in water. One might therefore expect that a cuprate superconductor surface treated with a sulfate-forming chemical would form a surface layer which is primarily $BaSO_4$. XPS spectra from the film of Example 3 which has been dipped in 1:100 $H_2SO_4/H_2O$ show that a sulfate film is formed by this treatment. The Y3d/S 2p spectrum shows the characteristic S 2p sulfate peak near 168–169 eV. The position of the Y 3d peak is consistent with that measured from the reference compound $Y_2(SO_4)_3$. Intensity analysis of the XPS spectra shows that the film is ~95% $BaSO_4$ and ~5% $Y_2(SO_4)_3$. Profilometer measurements show no detectable change in film thickness resulting from this treatment, and the x-ray diffraction peaks corresponding to the superconducting phase remain dominant. The sulfate film is found to be insulating and of sufficient thickness that sample charging in the XPS spectrometer is observed. Subsequent immersion of the film in water induces no observable changes in the XPS spectra, indicating that the sulfate film appears to be inert to water. This treatment thus also appears to be promising as a potential passivation technique. This treatment also appears to have slow etch rate or to be self-limiting, since etching for as long as 10 minutes did not remove the $YBa_2Cu_3O_{7-x}$ film.

EXAMPLE 5

Two samples of 123 film from Example 1 were dipped in 0.1 M and 0.01 M $Na_2S/H_2O$, each for 30 seconds. Cuprous sulfide, $Cu_2S$, is, virtually insoluble in water, and cupric sulfide, CuS also has a very low solubility, while the solubility of the corresponding Y sulfide, the semiconductor $Y_2S_3$, has not been measured, and barium sulfide BaS decomposes in water. A film consisting primarily of $Cu_2S$ and/or CuS with small amount of BaS and $Y_2S_3$ on $YBa_2Cu_3O_{7-x}$ is formed by treatment with a 0.1 M aqueous solution of $Na_2S$. A small Y 3d peak consistent with the reference compound $Y_2S_3$ is also observed, as are peaks corresponding to BaS. Immersion of this film in de-ionized water induces no changes in the Cu 2p, Y 3d, or S 2p spectra. However, the Ba 3d and O 1s peaks show signs of charging and shift with varying flood gun settings, though no other peaks are observed to shift. This is consistent with the decomposition of the BaS at the surface, resulting in the formation of an insulting species. No changes n the XPS spectra or in the visual appearance of the film are observed when the etching time is increased to as long as 15 min. After treatment for 30 s, no detectable change in film thickness is detected with a profilometer. However, x-ray diffraction measurements show no peaks corresponding to the superconducting phase. Even immersion of a superconducting film for 30 s in a much weaker 0.01 M aqueous solution of $Na_2S$ significantly reduces the intensities of the diffraction peaks corresponding to the superconducting phase. The effects of this treatment are thus not limited to the surface region, precluding use of this treatment for passivation of thin films. However, it is possible that bulk superconductors may be passivated with this treatment.

EXAMPLE 6

A 123 film from Example 1 was dipped for 30 seconds in 1% HI/EtOH. Cuprous iodide, CuI, is highly insoluble in water, while the corresponding Y and Ba iodides $YI_3$ and $BaI_2$ are soluble in water and other polar solvents. XPS spectra from a film of Example 1 which has been dipped in 1:100 HI:EtOH for 30 seconds, show that an iodide film is formed by this treatment, unlike $I_2$/EtOH, which was found[14] to be unreactive to $YBa_2Cu_3O_{7-x}$. Comparison of the data to XPS spectra from reference Y, Ba, and Cu compounds reveals that the composition of the iodide film is 80-90% CuI with smaller amounts of $YI_3$ and $BaI_2$. XPS also shows that subsequent immersion in water forms a layer of $Cu(OH)_2$ on the surface but the underlying CuI appears to remain intact, protecting the $YBa_2Cu_3O_{7-x}$ substrate. This treatment thus appears to be a useful passivation technique. This same etchant is also found to be an effective etchant for the bulk of the $YBa_2Cu_3O_{7-x}$ film, completely removing it in ~7 minutes. It should be noted that a nonaqueous etch is not necessary, a $HI/H_2O$ solution should yield similar results.

EXAMPLE 7

A 123 film from Example 1 was dipped in 1% $HF/H_2O$ for 30 seconds. No Cu $2p_{3/2}$ photoelectron signal is detectable from the HF-treated film. The results for the HF-tested film differ from a previous publication (4), in which the solvent was absolute ethanol. In that publication, the Y:Ba:Cu ratio in the fluoride film was found to be 1:4:3, while no Cu fluoride was detected when an aqueous solution was used (15,16). In Example 7 the Y:Ba ratio in the fluoride film is found to be 2:3. The difference can be attributed to the solubility of $CuF_2$ in water (see Table 1), so that this reaction product is dissolved in the etchant when water is the solvent. The presence of $CuF_z$ in the fluoride film when the solvent is absolute ethanol probably contributed to the failure to achieve complete passivation in the earlier publication (4). The bulk electrical properties have been reported (16) to be passivated by HF treatment, but the surface properties were not studied. In the present Example it is found that the Y and Ba fluoride peaks decrease in intensity with increasing time of immersion in water (noticeable within 5 minutes), with corresponding increases in the intensities of peaks associated with the superconducting phase. This is consistent with the slow dissolution of the fluoride film. Although $YF_3$ is insoluble in water (see Table 1), the dissolution of $BaF_2$, which is the primary constituent of the fluoride film, apparently leaves insufficient material to maintain film integrity. Since $YF_3$ and other rare earth fluorides are insoluble in water, these compounds seem particularly promising for potential passivation layers.

It has been demonstrated that 123 films can be passivated by forming a surface layer of native metal compounds. Conducting the passivation reaction in water results in removing the more soluble reactants so that the surface film is formed of the least insoluble native metal compound. Use of a native metal lessens the tendency to degrade the superconducting properties of the bulk HTSC superconductor.

The oxalate, sulfide and sulfate films are found to have no etchable reaction with water and no significant change in film thicknesses after aqueous treatment. The oxalate and sulfate etchants do not affect the superconducting phase. $Na_2S$ is found to degrade the polycrystalline superconductivity phase of $YBa_2Cu_3O_{7-x}$. However, it may not affect the superconducting properties of monocrystalline 123 or Thallium or Bismuth or Lead based superconductors.

In addition to the particular compounds exemplified, $CaC_2O_4$, $BiF_3$, $BiI_3$, $Bi_2S_3$, $SrC_2O_4$, SrS, $PbC_2O_4$, PbS, TlI, and $Tl_2S_3$ all have low solubilities and the formation of these compounds may be advantageous for the purpose of passivation.

References

1. R. P. Vasquez, B. D. Hunt, and M. C. Foote, Appl. Phys. Lett., 53, 2692 (1988).
2. R. P. Vasquez, M. C. Foote, and B. D. Hunt, Appl. Phys. Lett., 54, 1060 (1989).
3. M. Gurvitch, J. M. Valles, Jr., A. M. Cucolo, R. C. Dynes, J. P. Garno. L. F. Schneemeyer, and J. V. Wasczak, Phys. Rev. Lett., 63, 1008 (1989).
4. R. P. Vasquez, B. D. Hunt, and M. C. Foote, Appl. Phys. Lett., 54, 2373 (1989).
5. B. Roas, L. Schultz, and G. Endres, Appl. Phys. Lett., 53, 1557 (1988).
6. M. F. Yan, R. L. Barns, H. M. O'Bryan, Jr., P. K. Gallagher, R. C. Sherwood, and S. Jin, Appl. Phys. Lett., 51, 532 (1987).
7. R. L. Barns and R. A. Laudise, Appl. Phys. Letter., 51, 1373 (1987).
8. N. P. Bansal and A. L. Sandkuhl, Appl. Phys, Lett., 52, 323 (1988).
9. R. P. Vasquez and R. M. Housley, J. Appl. Phys. (in press, June 1, 1990 issue).
10. C.-A.Chang, Appl. Phys. Lett., 53, 1113 (1988).
11. C.-A.Chang and J. A. Tsai, Appl. Phys. Lett., 53, 1976 (1988).
12. D. M. Hill, H. M. Meyer III, J. H. Weaver, and D. L. Nelson, Appl. Phys. Lett., 53, 1657 (1988).
13. Q. X. Jia and W. A. Anderson, J. Appl. Phys., 66, 452 (1989).

14. R. P. Vasquez, M. C. Foote, and B. D. Hunt, J. Appl. Phys. 66, 4866 (1989).
15. Q. X. Jia and W. A. Anderson, J. Mater. Res. 4, 1320 (1989).
16. R. P. Vasquez, B. D. Hunt, and M. C. Foote, presented at the American Vacuum Society Topical Conference on High $T_c$ Superconducting Thin Films: Processing, Characterization, and Applications, Oct. 23, 1989, Boston, MA; proceedings to be published by the American Institute of Physics.
17. A. Tressaud, B. Chevalier, B. Lepine, J. M. Dance, L. Lozano, J. Grannec, J. Etourneau, R. Tournier, A. Sulpice, and P. Lejay, Mod. Phys. Lett. B, 2, 1183 (1988).
18. R. P. Vasquez, M. C. Foote, and B. D. Hunt, Appl. Phys. Lett. 55, 1801 (1989).
19. CRC Handbood of Chemistry and Physics, Eds. R. C. Weast and M. J. Astle (CRC Press, Boca Raton, FL, 1980), 61st Edition.
20. R. P. Vasquez, J. Electron Spectrosc. Relat. Phenom., 50, 167 (1990).
21. Y. Uwamino, A. Tsuge, T. Ishizuka, and H. Yamatera, Bull. Chem. Soc. Jpn. 59, 2263 (1986).
22. S. Sinharoy and A. L. Wolfe, J. Electron Spectrosc. Relat. Phenom. 18, 369 (1980).
23. S. Contarini and J. W. Rabalais, J. Electron Spectrosc. Relat. Phenom. 35, 191 (1985).
24. C. D. Wagner, W. M. Riggs, L. E. Davis, J. F. Moulder, and G. E. Muilenberg, Handbood of X-ray Photoelectron Spectroscopy (Perkin-Elmer Corp., Eden Prairie, NMN, 1979).
25. D. Lichtman, J. H. Craig, Jr., V. Sailer, and M. Drinkwine, Appl. Surf. Sci. 7, 325 (1981).
26. C. Perrin, D. Smon, D. Mollmard, M. T. Bajard, P. Baillif, and J. Bardolle, J. Chim. Phys. 81, 39 (1984).
27. I. Nakai, Y. Sugitani, K. Nagashima, and Y. Niwa, J. Inorg. Nucl. Chem. 40, 789 (1978).
28. M. Romand, M. Roubin, and J. P. Deloume, J. Electron Spectrosc. Relat. Phenom. 13, 229 (1978).
29. R. P. Vasquez, B. D. Hunt, M. C. Foote, J. Electrochem. Soc. (in press, July 1990 issue).

It is realized that only preferred embodiments of the invention have been described and that numerous substitutions, modifications and alterations are permissible without departing from the spirit and scope of the invention as defined in the following claims.

I claim:

1. A method of passivating the surface of a metal cuprate high temperature superconductor material comprising the steps of:
   reacting the native metals on the surface of the superconductor material with an aqueous solution of a reagent that does not degrade the superconducting properties of the material, said reagent being reactive with said native metal ions and being selected from compounds of the formula:

$M^3X$ where $M^3$ is selected from H, ammonium and Group I metal ions, and X is an anion selected from halide, sulfide, sulfate and oxalate; and
   forming a passivating layer on the surface of said material, said layer consisting essentially of a salt of the anion of the reagent and at least one of said native metal ions, said layer having a solubility in water of no more than $10^{-3}$M.

2. A method according to claim 1 in which the superconductor material is selected from compounds of the formula $M_x^1 M_y^2 Cu_z O_n$ where $M^1$ is a Group IIIA metal, Group IIIB metal, Group VB or a rare earth metal, $M^2$ is a Group IIA metal and x, y, z and n are integers, the ratio of y:x is about 2:1 and the ratio of z:x is at least 3, and the oxygen is present in an amount to satisfy valency of the metals and n is no more than 20.

3. A method according to claim 2 in which the superconductor material is $YBa_2Cu_3O_{7-x}$.

4. A method according to claim 3 in which the superconducting material is a thin, polycrystalline film mounted on the surface of a substrate.

5. A method according to claim 1 in which the reactive compound is selected from HI, $H_2SO_4$, HF, $(NH_4)_2S$, $Na_2S$ and $H_2C_2O_4$.

6. A method according to claim 1 in which the surface of the superconductor is immersed in said solution.

7. A method according to claim 1 in which the solution has a concentration of from 0.01 to 0.5 M.

8. A method according claim 7 in which the reactive compound is HI and the surface passivating layer comprises 80-90% CuI including small amounts of $YI_3$ and $BaI_2$.

9. A method according to claim 7 in which the reactive compound is $H_2SO_4$ and the surface passivating layer comprises about 95% $BaSO_4$ and 5% $Y_2(SO_4)_3$.

10. A method according to claim 7 in which the reactive compound is oxalic acid and the surface passivating layer contains equal amounts of $Y_2(C_2O_4)_3$ and $BaC_2O_4$.

11. A passivated superconductor produced according to the method of claim 1.

* * * * *